United States Patent [19]

Abe

[11] Patent Number: 5,008,553
[45] Date of Patent: Apr. 16, 1991

[54] ELECTRON BEAM LITHOGRAPHY METHOD AND APPARATUS

[75] Inventor: Takayuki Abe, Kawasaki, Japan

[73] Assignee: Kabushiki Kaisha Toshiba, Kawasaki, Japan

[21] Appl. No.: 341,977

[22] Filed: Apr. 24, 1989

[30] Foreign Application Priority Data

Apr. 22, 1988 [JP] Japan .................................. 63-99505
Nov. 10, 1988 [JP] Japan ................................ 63-284771

[51] Int. Cl.⁵ .......................................... H01J 37/304
[52] U.S. Cl. ................................ 250/492.2; 364/490; 430/296
[58] Field of Search ......................... 250/492.22, 492.2; 364/490; 430/296

[56] References Cited

U.S. PATENT DOCUMENTS 4,500,789 2/1985 Ban et al. ...................... 250/492.22

OTHER PUBLICATIONS

Otto et al., "A Parallel Processing Approach to Proximity Correction", J. Vac. Sci. Technol. B6(6), Nov./Dec. 1988 pp. 2048-2052.

Parikh, "Corrections to Proximity Effects in Electron Beam Lithography", J. Appl. Phys. 50(6) Jun. 1979, pp. 4371-4387.

Primary Examiner—Jack I. Berman
Attorney, Agent, or Firm—Foley & Lardner

[57] ABSTRACT

A charged beam lithography writes a pattern with charged beams on a sample. The pattern involves various shapes. For every position in the shapes in the pattern, degree of exposure due to a proximity effect caused by backward scattering charged from the shapes surrounding the position is calculated. A charged beam emission quantity corresponding to the calculated degree of exposure is subtracted from a set emission quantity to compensate the proximity effect and obtain an optimum charged beam emission quantity for the position. With charged beams of the optimum emission quantities thus obtained, the pattern is written with high dimensional accuracy.

19 Claims, 10 Drawing Sheets

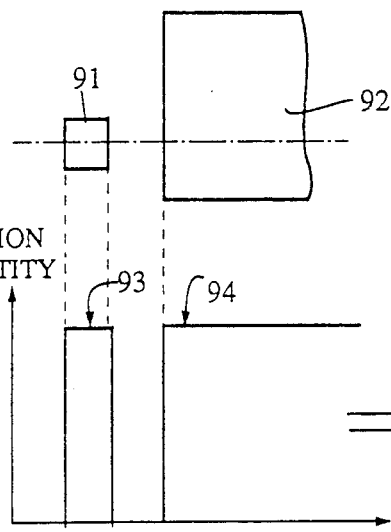
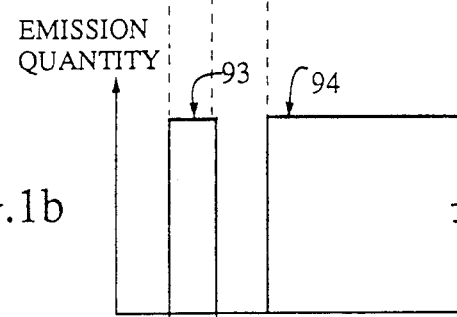
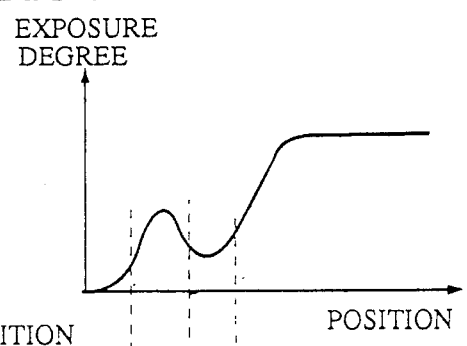
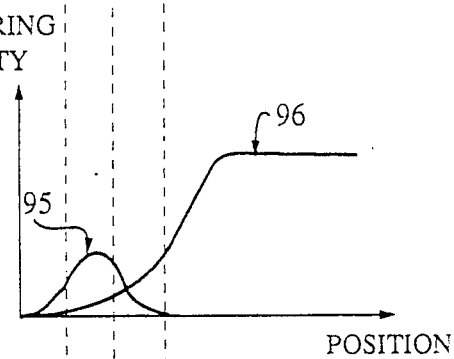
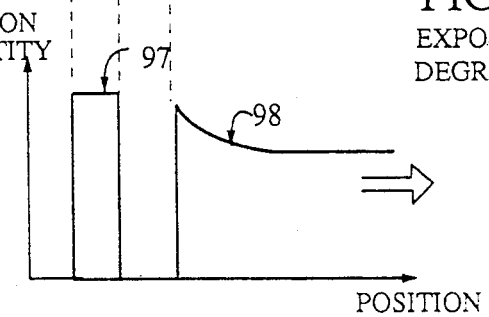
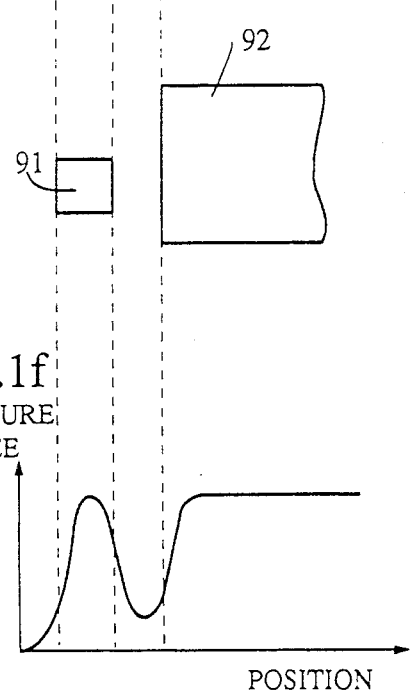

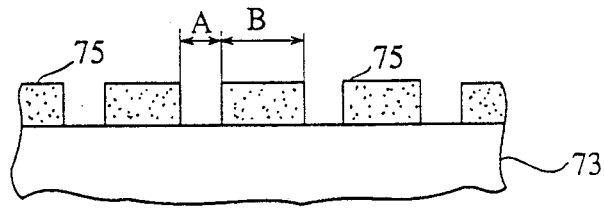
FIG.6a
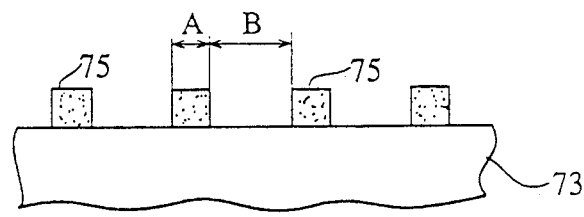
FIG.6b
FIG.7a
FIG.7b
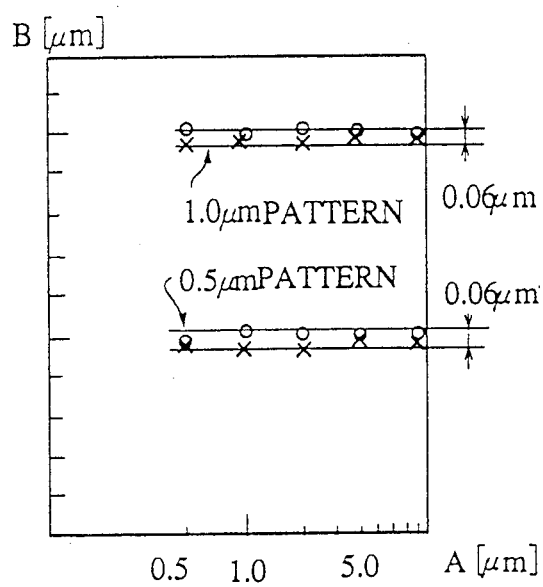
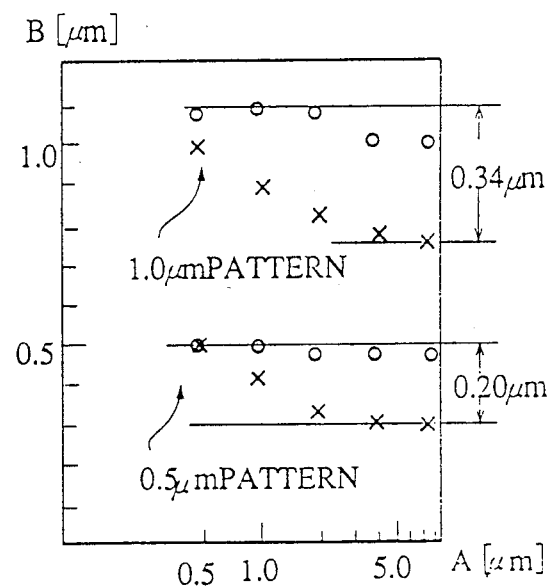

ELECTRON BEAM LITHOGRAPHY METHOD AND APPARATUS

BACKGROUND OF THE INVENTION

1. Field of the Invention

The present invention relates to a method of writing fine patterns such as semiconductor integrated circuits with electron beams. Particularly, this invention relates to an electron beam lithography method and apparatus which can compensate proximity effects occurring on patterns to be written, by efficiently calculating optimum emission quantities of electron beams.

2. Description of the Prior Art

In recent years, various electron beam lithography systems are employed to write fine patterns on samples such as semiconductor wafers.

In writing a pattern on a sample with the electron beam lithography system, a part of the sample that shall not be exposed to electron beams is covered with resist, and the electron beams are emitted towards the sample. Electrons emitted towards the sample collide with nuclei, etc., of the sample and scatter. This is called backward scattering. The scattered electrons expose the part of the sample covered with the resist. This is called the proximity effect. The proximity effect may change the shape and dimensions of the part of the sample under the resist from those required.

To compensate the proximity effect, there is an emission quantity correction technique. In writing each of shapes involved in a pattern using electron beams, this technique takes into consideration the backward scattering of electrons due to the shapes surrounding the shape in question. According to the sizes and concentration of the surrounding shapes, electron beam emission quantities for the shape to be written is adjusted.

To determine the electron beam emission quantities, the emission quantity correction technique conventionally employs a matrix. The matrix expresses relations between the electron beam emission quantities and the exposure amounts at respective positions in the pattern. By calculating an inverse matrix of the matrix, optimum electron beam emission quantities for the respective positions are obtained. If this matrix is directly applied for VLSI patterning, a time necessary for calculating the inverse matrix may increase to several hundred hours, even with a very high speed computer. Due to this long calculation time, it is practically impossible to apply the conventional matrix technique for LSIs and VLSIs to correct electron beam emission quantities and compensate the proximity effects in patterning the LSIs and VLSIs.

SUMMARY OF THE INVENTION

An object of the present invention is to provide an electron beam lithography method and apparatus which can efficiently obtain optimum electron beam emission quantities for respective shapes involved in a pattern to be written and prevent the dimensional accuracy of the shapes from deteriorating due to the proximity effects.

Another object of the present invention is to provide an electron beam lithography method and apparatus which can shorten a time necessary for determining optimum electron beam emission quantities for respective shapes involved in a pattern to be written.

Still another object of the present invention is to provide an electron beam lithography method and apparatus which can shorten a time necessary for calculating optimum electron beam emission quantities for respective shapes involved in a pattern to be written, by omitting repetitive calculations of the emission quantities for those shapes equally influenced by the proximity effects.

A first aspect of the invention calculates for each position in each shape in the pattern to be written a degree of exposure due to the backward scattering caused by rectangular shapes around the position. An electron beam emission quantity corresponding to the exposure is subtracted from a set emission quantity to obtain an optimum electron beam emission quantity for the position.

Namely, optimum electron beam emission quantities for respective positions $(x_j, y_j)$ in each shape involved in the pattern to be written are first found. Then, electron beams of the optimum quantities are emitted to a sample to write the shapes on the sample.

With respect to each of the positions $(x_j, y_j)$, all rectangular shapes $T_i$ within a predetermined distance "r" from the position are extracted. Based on a distance from the position to about the center of each of the rectangles $T_i$ and the size of the rectangle in question, each emission correction quantity $Q_{ij}$ for compensating the backward scattering due to the rectangle in question is obtained. Emission correction quantities $Q_{ij}$ of all the rectangles $T_i$ are summed up to obtain a total emission correction quantity $R_j$ for the position in question. And, for example, the total emission correction quantity $R_j$ is deducted from a set emission quantity $S$ to obtain the optimum emission quantity for the position in question.

According to the first aspect of the invention, a table is prepared in advance as a means for finding the emission correction quantities $Q_{ij}$. The table defines relations between the emission correction quantities and the distances from positions $(x_j, y_j)$ to the rectangles $T_i$ and sizes of the rectangles $T_i$. From the table, the emission correction quantities $Q_{ij}$ are read.

Alternatively, a relational expression of the emission correction quantities is prepared in advance with the distances from the positions $(x_j, y_j)$ to the rectangles $T_i$ and the sizes of the rectangles $T_i$ as variables. The variables are substituted by actual distances and sizes to find the emission correction quantities $Q_{ij}$.

For each of the positions $(x_j, y_j)$ in each of the shapes involved in the pattern, the amount of backward scattering caused in writing the adjacent rectangles $T_i$ is calculated. The backward scattering is negligible if one rectangle is distant from the position in question. Therefore, only by summing up the effects of the backward scattering of the adjacent rectangles, an emission correction quantity for the position in question will easily be obtained. By deducting the emission correction quantity from the predetermined equal emission quantity, an optimum emission quantity for the position in question is obtained. As a result, the pattern can be written substantially with no influence of the backward scattering.

In this way, the first aspect of the invention can automatically determine the optimum emission quantities at high speed without complicated processes of finding the inverse matrix as required by the conventional matrix technique. By emitting electron beams to the sample according to the calculated optimum emission quantities, the pattern can be written with high dimensional accuracy.

According to a second aspect of the invention, shapes which may receive the same proximity effect, involved in a pattern are omitted for their repetitive correction calculations to shorten a calculation time.

In this aspect of the invention, a pattern writing area on a sample is divided into a plurality of small zones, and a correction quantity for each zone is determined to compensate the proximity effect on the zone. Among the divided zones, there will be identical zones "A" having identical internal shapes of the same kind and arrangement as well as having identical peripheral zones "B" that contain identical internal shapes of the same kind and arrangement. In this case, only one of the zones "A" is calculated for its correction quantity for compensating the proximity effect, and a result of the calculation is applied for the other zones "A".

According to the second aspect of the invention, for the small zones A having the same internal shapes and the equal peripheral zones B, i.e., for the small zones A which receive the same proximity effect are avoided from repetitive correction calculations, thus drastically reducing a correction calculation time.

These and other objects, features and advantages of the present invention will be more apparent from the following detailed description of preferred embodiments in conjunction with the accompanying drawings.

BRIEF DESCRIPTION OF THE DRAWINGS

FIGS. 1a to 1f are views explaining the principle of correcting the proximity effect;

FIGS. 6a and 6b are sectional views showing a blanking pattern and a residual pattern, respectively;

FIGS. 7a and 7b are plots of pattern dimensional errors;

DETAILED DESCRIPTION OF THE EMBODIMENTS

Figure 2:
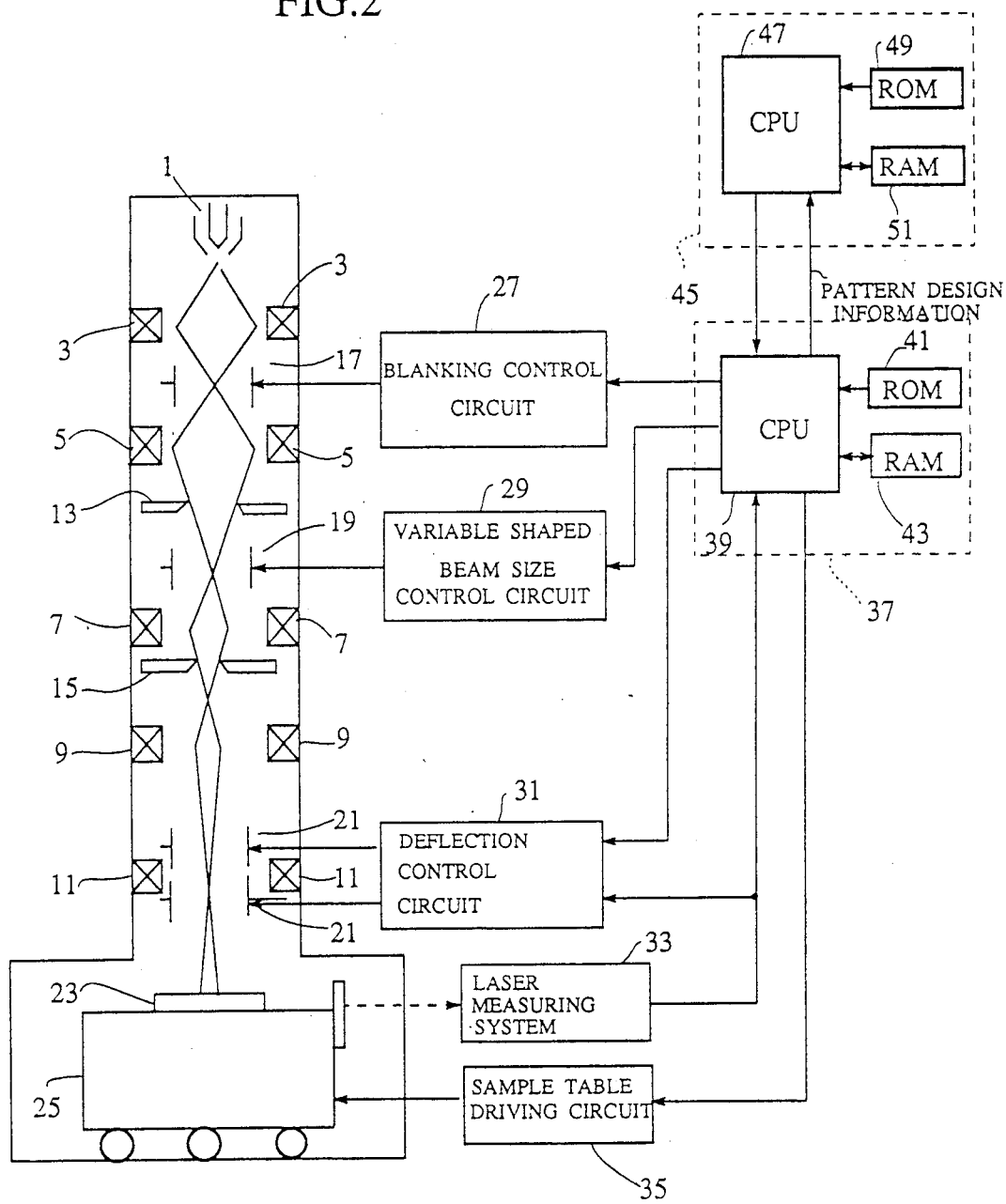
FIG. 2 is a schematic view showing an electron beam lithography apparatus according to a first embodiment of the invention.

Before explaining the embodiments, the principle of correcting the proximity effect will be explained with reference to FIGS. 1a to 1f.

In FIG. 1a, a small shape 91 is located in the vicinity of a large shape 92. If electron beam emission quantities 93 and 94 for the shapes 91 and 92 are equal to each other as shown in FIG. 1b, left edges of the shapes 91 and 92 may be less affected by the backward scattering of electrons in comparison with a central part of the shape 92. Therefore, the left edges of the shapes 91 and 92 will be less exposed by electron beams in comparison with the central part of the shape 92.

FIG. 1c shows influences of the backward scattering electrons. A numeral 95 represents the amount of backward scattering due to the shape 91, and a numeral 96 the amount of backward scattering due to the shape 92.

With respect to the emission quantities of electron beams shown in FIG. 1b, the shapes will be exposed as shown in FIG. 1e. As apparent in FIG. 1e, the shape 91 is less exposed in comparison with the shape 92.

To cope with this uneven exposure, the invention deducts the effect of the backward scattering from an equal predetermined emission quantity to set a new emission quantity for every position as shown in FIG. 1d. An electron beam emission quantity 97 for the shape 91 is larger than an electron beam emission quantity 98 for the shape 92. The emission quantity 98 for the shape 92 is further reduced for portions except the left edge of the shape 92. Accordingly, the more the shapes concentrate, the smaller the electron beam emission quantities, while the less the shapes concentrate, the larger the electon beam emission quantities. In this way, exposure degrees of the shapes are adjusted to compensate the proximity effects, as shown in FIG. 1f.

An amount of the backward scattering caused by a rectangle with respect to a vicinity position (x, y) is uniquely determined by a distance from a center of the rectangle to the position (x, y) and the size of the rectangle. If there are a plurality of rectangles around the position (x, y), the total influence of the rectangles can be obtained only by summing up the influences of the respective rectangles.

Based on this fact, the invention can automatically determine optimum emission quantities of electron beams for respective positions at high speed without complicated processes as those required in finding the inverse matrix by the matrix technique.

An electron beam lithography apparatus according to the first embodiment of the invention will now be explained with reference to FIG. 2.

In the figure, the electron beam lithography apparatus of the invention comprises an electron gun 1 for emitting electron beams, various kinds of lenses 3, 5, 7, 9 and 11, aperture masks 13 and 15 for shaping the deflector 19, a scanning deflector 21, and a sample table 25 for placing a target 23 such as a semiconductor substrate.

The electron beams emitted from the electron gun 1 are turned on and off by the blanking deflector 17. By adjusting emission intervals with the blanking deflector 17, quantities of the electron beams are changed according to positions on the substrate. The electron beams passed through the blanking deflector 17 are shaped into rectangular beams by the beam shaping deflector 19 and beam shaping aperture masks 13 and 15. The size of the rectangle is variable with the deflector 19 and masks 13 and 15. Namely, optical overlap of the masks 13 and 15 is variable by the deflector 19 to obtain a rectangular beam of required size. The shaped beams are deflected and scanned by the scanning deflector 21 on the target 23 to write a required shape on the target 23. In this apparatus, the maximum size of a variable shaped beam is 2 um in height and 2 um in width.

The electron beam lithography apparatus further comprises a blanking control circuit 27 for driving and controlling the blanking deflector 17, a variable shaped beam size control circuit 29 for driving and controlling the beam shaping deflector 19, a deflection control circuit 31 for driving and controlling the scanning deflector 21, a laser measuring system 33 for detecting a position of the sample table 25, and a sample table driving circuit 35 for controlling a position of the sample table 25. The blanking control circuit 27, variable shaped beam size control circuit 29, deflection control circuit 31 and sample table driving circuit 35 are operated according to control signals from a first computer 37.

The first computer 37 comprises a CPU 39, a ROM 41 and a RAM 43. The ROM 41 stores a main program for controlling electron beam emission. The CPU 39 follows the main program and pattern design information prepared in advance, and outputs the above-mentioned control signals to emit electron beam.

The apparatus of the embodiment further comprises a second computer 45 for finding emission correction quantities to be described later. The second computer 45 comprises a CPU 47, a ROM 49 and a RAM 51. The ROM 49 stores a correction program, conversion table, etc., for finding optimum emission quantities for respective positions in a pattern. The CPU 47 follows the pattern design information and correction program to calculate the optimum emission quantities and supply them to the first computer 37.

A pattern writing method employed by the apparatus, particularly a method of determining the optimum emission quantities in the second computer 45 will be explained with reference to a flowchart of FIG. 3.

Figure 3:
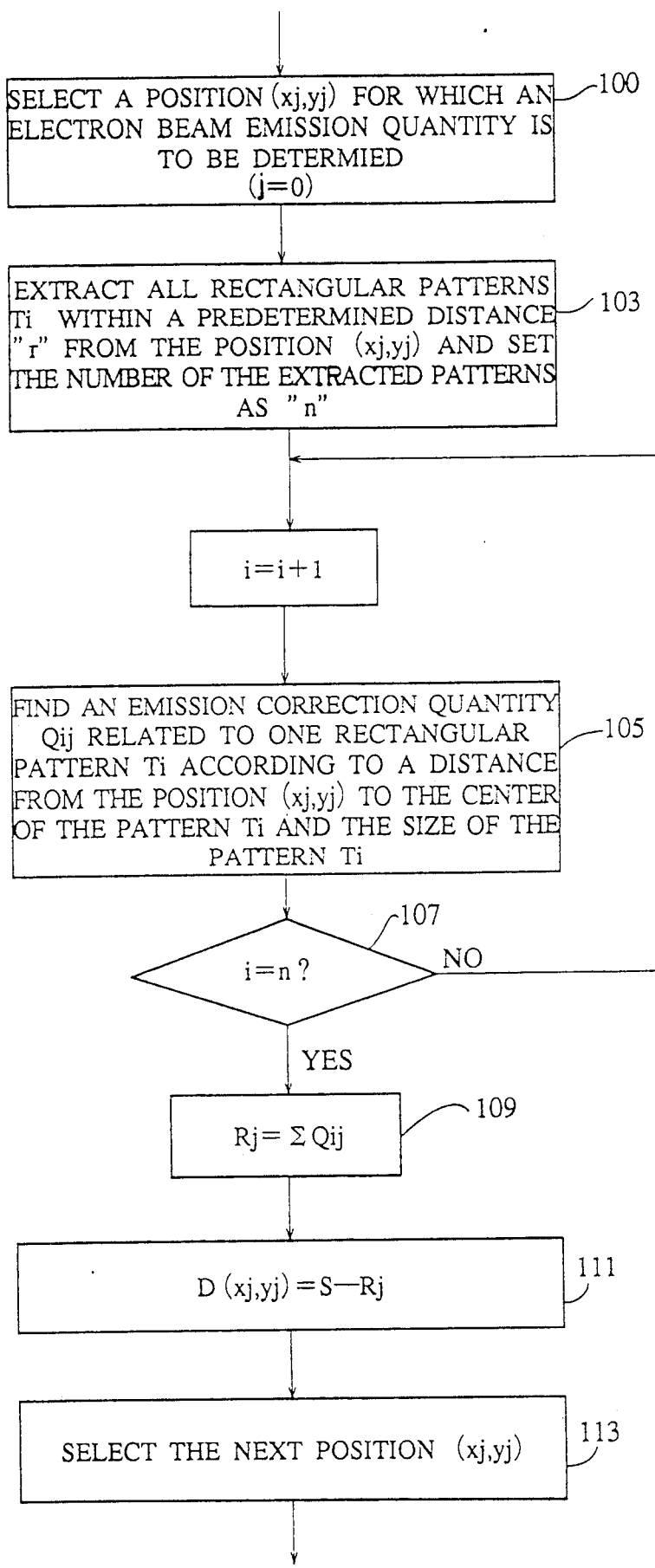
FIG. 3 is a flowchart explaining a sequence of processes of the first embodiment.
Figures 4, 5:
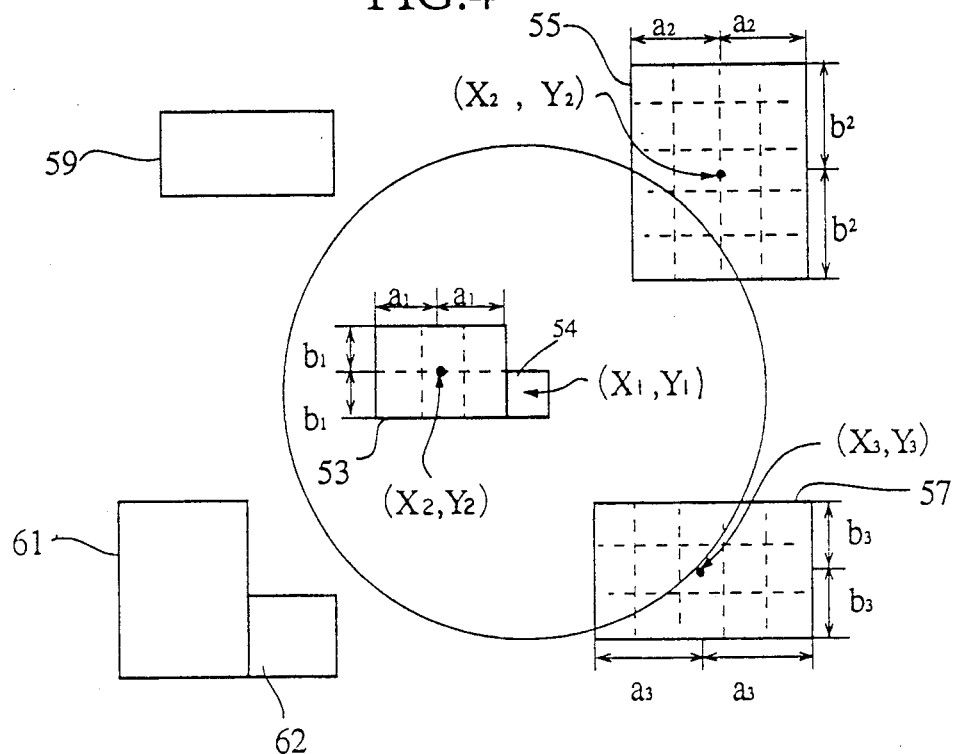
FIG. 4 is a view showing a position (x1, y1) in one shape for which an electron beam emission correction quantity is to be determined, and positional relations between the position and rectangular shapes around the position.
FIG. 5 is a view showing an example of a table used for finding emission correction quantities.

In step 100 of FIG. 3, a position (x1, y1) shown in FIG. 4 is selected as one of positions (xj, yj) for which an optimum emission quantity is to be determined. The position (x1, y1) is a center of a unit rectangle that can be written by one shot of the electron beam. For all shapes involved in a pattern to be written, respective positions (xj, yj) are selected.

In step 103, rectangles existing within a predetermined distance "r" (3 $\sigma B$, for example) from the position (x1, y1) are extracted. In FIG. 4, rectangles 53, 54, 55 and 57 are extracted while rectangles 59, 61 and 62 are ignored. Here, $\sigma B$ is a backward scattering affecting area, and the backward scattering is negligible if the distance exceeds 3 $\sigma B$.

In step 105, according to the distance from the position (x1, y1) to the rectangle 53 and the size of the rectangle 53, an emission correction quantity for the position (x1, y1) to compensate the backward scattering caused by the rectangle 53 is calculated. In this (x2, y2), and the size (2ai×2bi) of the rectangle 53 is (2a2×2b2). Based on these values, an emission correction quantity Qij for the position (x1, y1) due to the rectangle 53 is obtained as Qi1.

In step 107, emission correction quantities Q11 and Q31 due to the other rectangles 55 and 57 are similarly obtained.

In step 109, the sum of these emission correction quantities Qi1 is obtained as a total emission correction quantity Rj (=R1) for the position (x1, y1).

In step 111, the total emission correction quantity R1 is deducted from an equal emission quantity S set in advance to obtain an optimum emission quantity D (x1, y1) for the position (x1, y1) as follows:

$$D(x1, y1) = S - R1 \tag{1}$$

After the optimum emission quantity (x1, y1) for the position D (x1, y1) is determined, the next position (x2, y2) is selected to calculate its optimum emission quantity D (x2, y2) in step 113. These processes are repeated to determine optimum emission quantities D (xj, yj) for all positions (xj, yj) in the shape to be written.

In this way, the shapes involved in the pattern are written on the sample with electron beams with optimum emission quantities to realize high dimensional accuracy of the pattern.

A way of determining the optimum emission quantities will be explained in more detail.

The relations of distances from emission quantity setting positions (xj, yj) to centers (Xi, Yi) of rectangles, sizes (2ai, 2bi) of the rectangles and emission quantities D(xj, yj) are expressed as follows, respectively:

$$D(xj, yj) = 1 - k\Sigma[\{erf\{(Xi-xj+ai)/\sigma B\} - erf\{(Xi-xj-ai)/\sigma B\}\} \times [erf\{(Yi-yj+bi)/\sigma B\} - erf\{(Yi-yi-bi)/\sigma B\}] \tag{2}$$

where "k" is a coefficient for weighting the degree of exposure due to the backward scattering caused by the rectangles. The weighting coefficient is 0.4 in the embodiment. In the expression (2), an initial set emission quantity S is standardized as 1. The error function erf($\mu$) is defined as follows:

$$erf(u) = \frac{1}{2\sqrt{\pi}} \int_o^x \exp(-u^2) \, du. \tag{3}$$

The whole of the second term of the expression (2) is the total emission correction quantity Rj, and each term of the sum is the emission correction quantity Qij of each rectangle.

The emission quantities according to the expression (2) can be obtained as follows.

Firstly, a table T for the error function erf($\mu$) is prepared. Rectangles within the distance 3$\sigma B$ are collected. To do so, arguments ($\mu$) of the table T are from 0 to 3.0 at 1/100 intervals.

To obtain an emission quantity for each of the positions (xj, yj), all rectangles existing within the distance r=3$\sigma B$ from the position in question are extracted. Based on the positions (Xi, Yi) and sizes (2ai, 2bi) of the rectangles, the following values are obtained:

$$N_1^X = (Xi - xj + ai)/\sigma B,$$

$$N_2^X = (Xi - xj - ai)/\sigma B,$$

$$N_1^Y = (Yi - yj + bi)/\sigma B,$$

$$N_2^Y = (Yi - yj - bi)/\sigma B. \tag{4}$$

By using the table T, the emission correction quantities Qij for the rectangles are obtained as follows, respectively:

$$Qij = [\sqrt{k\{erf(N_1^X)\}} - \sqrt{k\{erf(N_2^X)\}}] \times [\sqrt{k\{erf(N_1^Y)\}} - \sqrt{k\{erf(N_2^Y)\}}] \tag{5}$$

The emission correction quantities of the rectangles are summed up (Rj = $\Sigma$Qij) and deducted from the predetermined value S (standardized as 1 in this embodiment) to obtain a standardized optimum emission quantity for the position in question. Therefore, an actual optimum emission quantity for the position can be obtained by multiplying the standardized optimum emission quantity by a set emission quantity S.

In the expression (5), the error function erf($\mu$) is multiplied by the root of coefficient k ($\sqrt{k}$) to simplify calculation of the expression (5).

By preparing tables of $\sqrt{k} \cdot \text{erf}(\mu)$, multiplication is not necessitated in calculating the quantities Qij so that the quantities Qij may be obtained more easily. In the example, one table is prepared for the error function $\sqrt{k}$ erf($\mu$). Alternatively, one of table of FIG. 5 may be prepared for the terms $[\sqrt{k}\{\text{erf}(N_1^X)\} - \sqrt{k}\{\text{erf}(N_2^X)\}]$. In both the cases, a calculation time can remarkably be shortened in comparison with calculating the error functions for every position.

FIGS. 6a, 6b, 7a and 7b are views showing dimensional controllability developed in experiments made according to embodiment of the invention. In the figures, a substrate 73 is silicon and resist 75 PMMA (polymethyl methacrylate). FIG. 6a shows a blanking pattern while FIG. 6b shows a residual pattern. The experiments have been carried out with 1 $\mu$m of resist thickness, 40 keV in acceleration voltage, 50 A/cm$^2$ in current density and 40 $\mu$c/cm$^2$ in maximum emission quantity.

Dimensional variations with no correction against the proximity effects have been 0.2 to 0.34 $\mu$m as shown in FIG. 7b. By using the method of this embodiment of the invention, the dimensional variations have been reduced to 0.06 um as shown in FIG. 7a. Namely, the method of the embodiment of the invention can provide sufficiently practical correction accuracy. In FIGS. 7a and 7b, marks "•" represent dimensions of the blanking pattern shown in FIG. 6a, while marks "X" represent dimensions of the residual pattern shown in FIG. 6b.

The inventors have applied this embodiment for an element separation layer of a 4M-DRAM of 0.5 um rules. With the use of a large computer, a processing time needed for the correction has been about two half hours. This processing time is sufficiently practical.

As described in the above, the first embodiment finds the emission correction quantity Rj due to peripheral rectangles Ti for every position (xj, yj) for which an optimum emission quantity is to be determined. The emission correction quantity Rj is deducted from the set emission quantity S to determine the optimum emission quantity for the position (xj, yj). Therefore, dimensional variations of the pattern due to the proximity effects can be suppressed to improve dimensional accuracy of the pattern.

In addition, with respect to an optional position, an emission correction quantity can be obtained only by considering rectangles around the position so that the calculation of the emission correction quantity can be completed in a short time. By preparing the tables, the calculation time of the emission correction quantity can further be shortened so that the embodiment is sufficiently applicable for VLSIs.

A modification of the first embodiment of the invention will be explained.

The expression (1) will be modified as follows:

$$D(xj, yj)\Sigma = 1 - k + k\Sigma_i[\{\text{erf}((Xi' - xj + ai)/\sigma B) - \text{erf}((Xi' - xj - ai)/\sigma B)\} \times \{\text{erf}((Yi' - yj + bi)/\sigma B) - \text{erf}((Yi' - yj - bi)/\sigma B)\}] \quad (6)$$

Based on this expression, correction processes can be carried out. In this expression, Xi' and Y' represent positional coordinates of inverted rectangles. A coefficient "k" in the second term of the expression (6) is an emission correction quantity against the backward scattering when electron beams are emitted to the whole area of a pattern to be written. A mark "$\Sigma$" in the third term of the expression (6) means to sum up all rectangles obtained by black-and-white-inverting the pattern. Therefore, in the expression (6), the emission correction quantity R' against the backward scattering caused by emitting electron beams to the whole area of the pattern is deducted from a set value 1. Also, a result of, the deduction is added to emission correction quantities against the backward scattering caused by the rectangles that are not irradiated with the electron beams. Namely, the expression (6) is equivalent to the expression (1) in the result. In this modification, tables T are prepared in advance similar to the first embodiment.

Figure 8A:
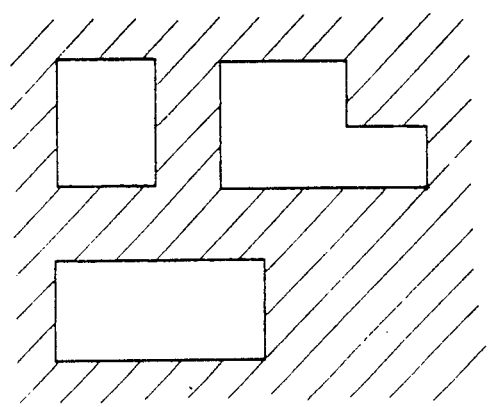
FIGS. 8a to 8d are views explaining a modification of the first embodiment of FIG. 3.
Figure 8B:
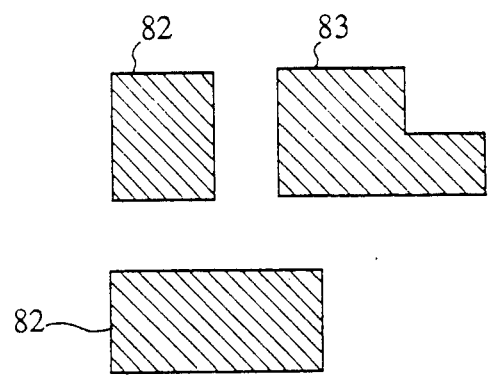

In FIG. 8a, a pattern to be written is indicated with a hatched portion and irradiated with electron beams. The pattern is black-and-white-inverted to form inverted shapes 81, 82 and 83 as shown in FIG. 8b. Then, a position (xj, yj) for which an emission quantity is to be determined is selected, and the inverted rectangles 81 and 82 existing within a predetermined distance "r" from the position (xj, yj) are selected among the inverted shapes. If another position (xj, yj) shown in FIG. 8d is selected, rectangles to be extracted will be 81, 82 and 83a.

Figure 8C:
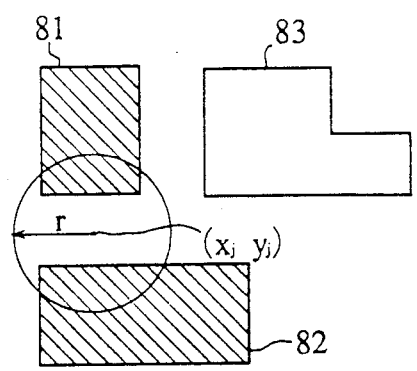
Figure 8D:
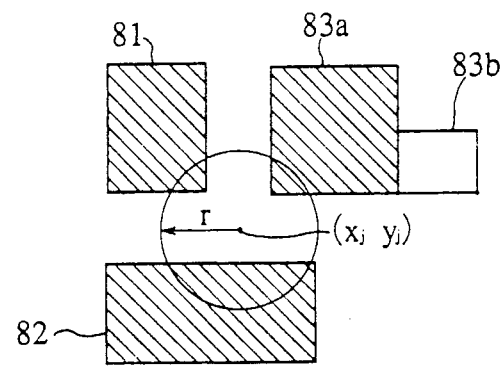

To obtain an emission quantity at each position (xj, yj), all inverted rectangles existing within the distance r=3$\sigma$B around the position (xj, yj) are extracted as shown in FIGS. 8c and 8d. Based on positions (Xi, Yi) and sizes (2ai, 2bi) of the selected inverted rectangles, the following values are obtained:

$$N_1^X = (Xi - xj + ai)/\sigma B$$

$$N_2^X = (Xi - xj - ai)/\sigma B$$

$$N_1^Y = (Yi - yj - bi)/\sigma B$$

$$N_2^Y = (Yi - yi - bi)/\sigma B. \quad (7)$$

By using the tables T, respective emission correction quantities Qij for the position is obtained as follows:

$$Qij' = [\sqrt{k}\{\text{erf}(N_1^X)\} - \sqrt{k}\{\text{erf}(N_2^X)\}] \times [\sqrt{k}\{\text{erf}(N_1^Y)\} - \sqrt{k}\{\text{erf}(N_2^Y)\}]. \quad (8)$$

The emission correction quantities of all the inverted rectangles are obtained, summed up (Rj' = $\Sigma$Qij') and added to a value that is obtained by deducting "k" from a fixed value (1 - k), to obtain an optimum emission quantity for the position (xj, yj).

In this time, "k" is equivalent to the emission correction quantity R' against the backward scattering caused by emitting electron beams to the whole area of the pattern.

As mathematically apparent, the emission quantity obtained according to this modification is the same as that obtained by the first embodiment, k and the dimensional controllability and correction accuracy of the modification are the same as those obtained by the first embodiment. Whether the modification is advantageous or the first embodiment is advantageous is determined depending on the size of the area of a pattern to be written. If the area is small, the first embodiment will be advantageous because the number of rectangles to be referred is small to shorten a calculation time. On the contrary, if the area is large the number of rectangles to be referred is small to shorten a calculation time.

The invention is not limited to the embodiment and modification mentioned in the above. For example, as the means for obtaining the emission correction quantities Qij, part of the expression (5) (the error function erf($\mu$) in the embodiment) will not be prepared as tables, but the whole of the expression (5) is prepared as a table to directly read the emission correction quantities Qij from the table according to distances from positions (xj, yj) to rectangles Ti and the sizes of the rectangles Ti. Alternatively, no table is prepared but the distances and sizes are put in the variables of the expression (5) to obtain the emission correction quantities Qij purely by calculation. The present invention is applicable not only for electron beam lithography apparatuses but also for ion beam lithography apparatuses.

The embodiments have extracted rectangles distanced by the predetermined radius "r" from each position (xj, yj). However, the invention is not limited to this method. For example, the area of a pattern to be written on a sample may be divided into small zones, and rectangles are extracted belonging to zones surrounding a zone containing a position (xj, yj) for which an emission quantity is to be determined.

In the embodiments, the first and second computers have been provided for carrying out the main program for controlling electron beam emission and the correction program for obtaining the optimum emission quantities. However, a single computer may be employed to carry out both the programs.

In the embodiments, when the correction of the electron beam emission is carried out at a unit rectangle 54, the unit rectangle 54 is included in the rectangle 53 on the correction process by taking the backward scattering of electrons due to the unit rectangle 54 into consideration. However, in the case of not taking into consideration the backward scattering due to the unit rectangle 54, it is possible to carry out a correction process in which the unit rectangle 54 is not included in the rectangle 53.

With reference to FIGS. 9 to 12, the second embodiment of the electron beam lithography apparatus of the invention will be explained. The apparatus of the second embodiment avoids repetitive correction calculations to be done for shapes receiving the same proximity effects, thus shortening a correction calculation time.

Figure 9:
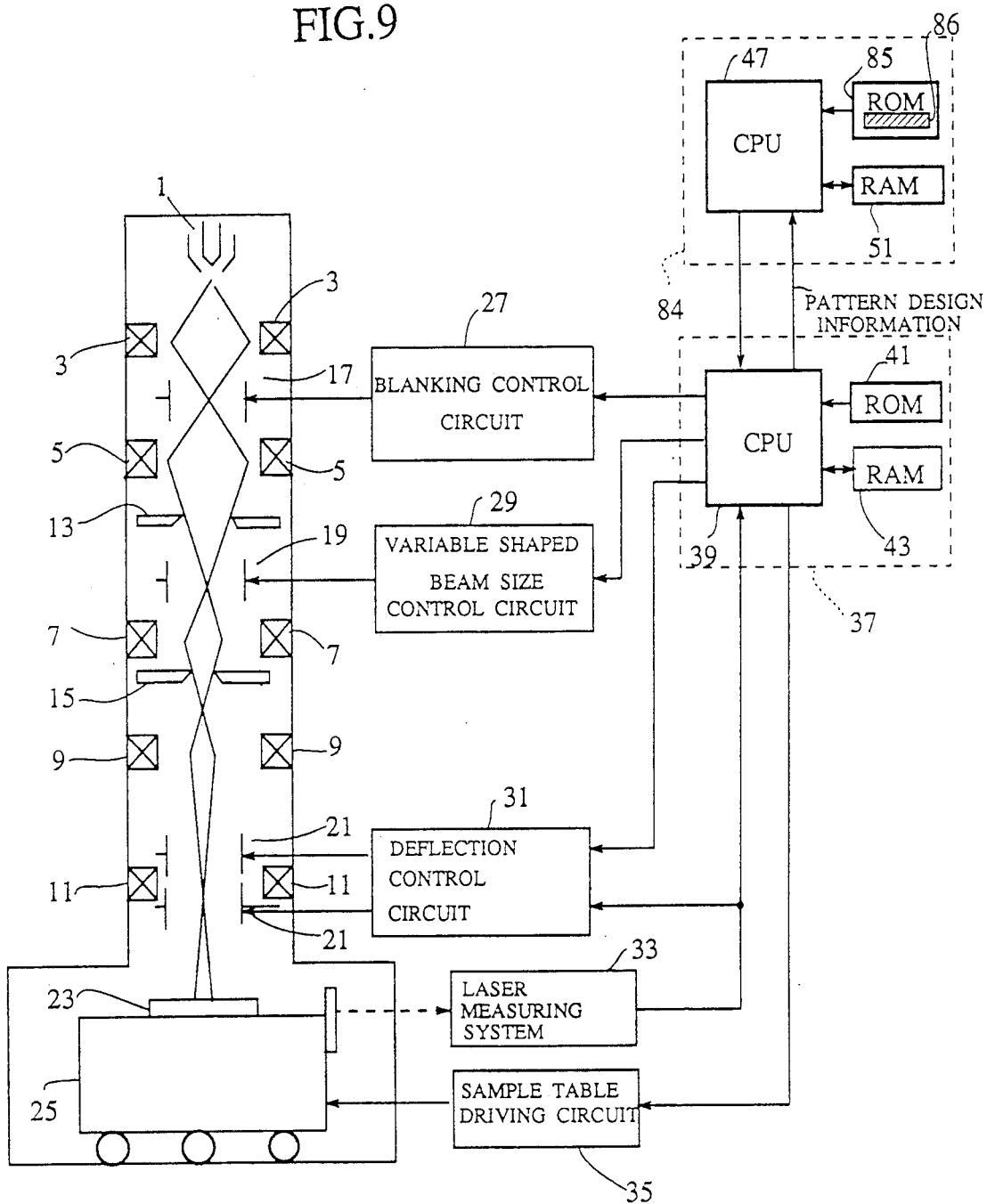
FIG. 9 is a schematic view showing an electron beam lithography apparatus according to a second embodiment of the invention.

As shown in FIG. 9, a second computer 84 of the apparatus of the second embodiment has a ROM 85 that includes a program for omitting the repetitive correction calculations and a table 86 to be explained later. Other arrangements of the second embodiment are the same as those of the first embodiment, therefore detailed explanations of them will be omitted.

Figure 10:
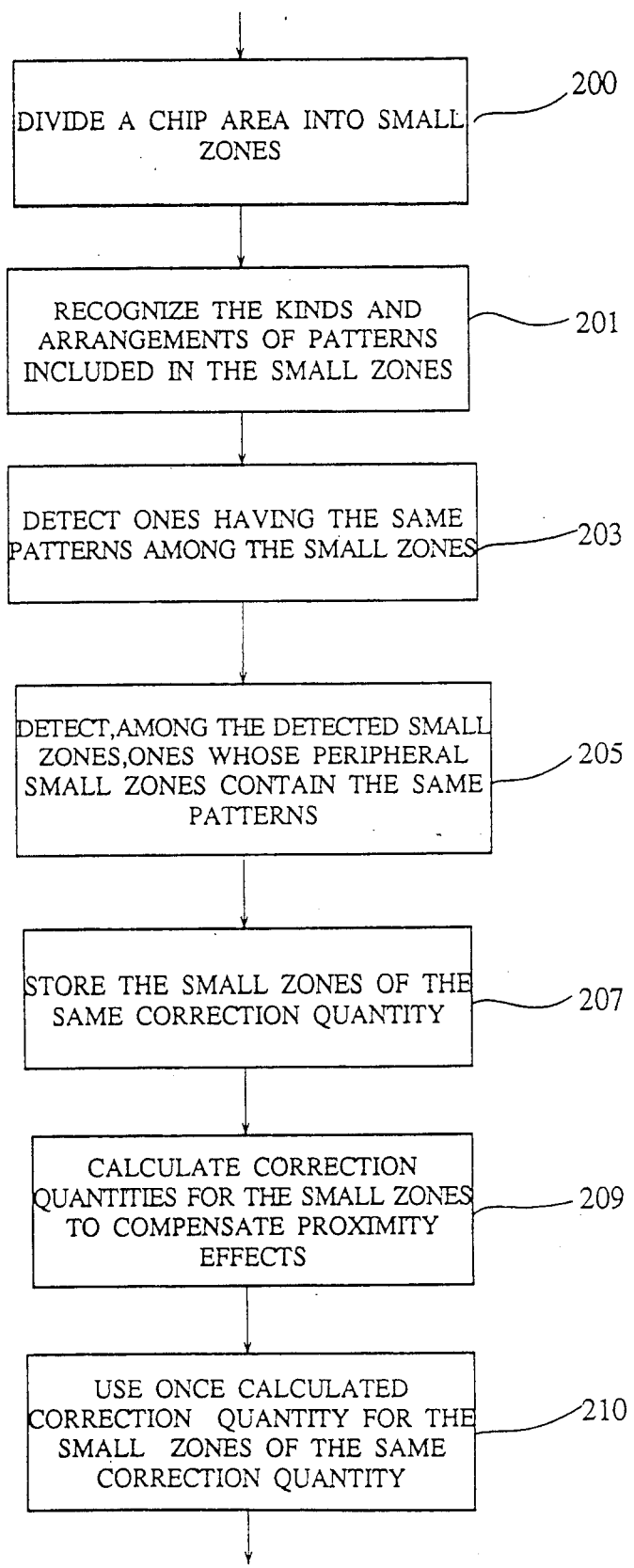
FIG. 10 is a flowchart showing a sequence of processes of the second embodiment.

With reference to a flowchart of FIG. 10, a pattern writing method of the second embodiment will be explained. Particularly, a method of omitting the repetitive correction calculations in the second computer 84 will generally be explained.

In step 200, a chip area (an area where a pattern is to be written) is divided into small zones according to pattern data of an LSI.

In step 201, the kinds and arrangements of internal shapes involved in each small zone are recognized.

In step 203, small zones "A" that contain identical internal shapes are detected.

In step 205, the kinds and arrangements of internal shapes included in small zones "B" surrounding each small zone A are recognized. Then, identical ones of the small zones A having the small zones B corresponding ones of which contain identical internal shapes, are detected.

In step 207, the identical small zones A that contain the identical internal shapes and identical peripheral zones B are stored in the table 86. Namely, the stored small zones A have the same correction quantities, respectively.

In step 209, for every small zone Aj, a correction quantity for correcting the proximity effect is calculated according to the shapes contained in the peripheral small zones, etc. In this calculation, the method of the first embodiment or the known matrix method may be employed.

By virtue of the information stored in the table 86, the small zones of the same correction quantity will not be processed repeatedly to obtain their correction quantities but a once calculated value is reused, and this value is sent to the first computer 37. Namely, repetitive calculations are avoided, and the proximity effect is corrected for every small zone. The first computer 37 sets optimum emission quantities of electron beams based on the calculated correction quantities.

Sequences of the method of omitting the repetitive correction calculations will be explained in detail with reference to FIGS. 11 and 12.

Figure 11A:
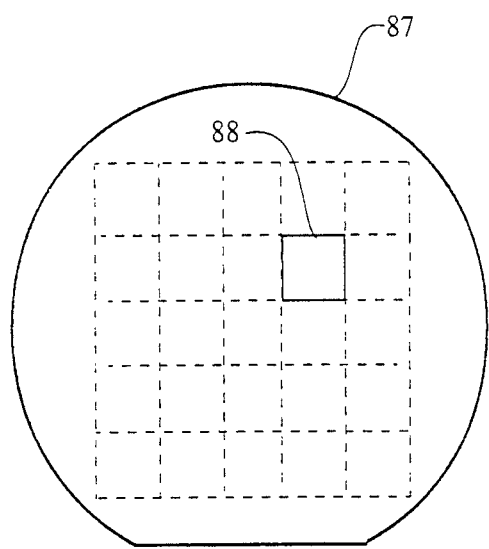
FIGS. 11 and 12 are views explaining a way of finding electron beam emission correcting quantities in the second embodiment.
Figure 11B:
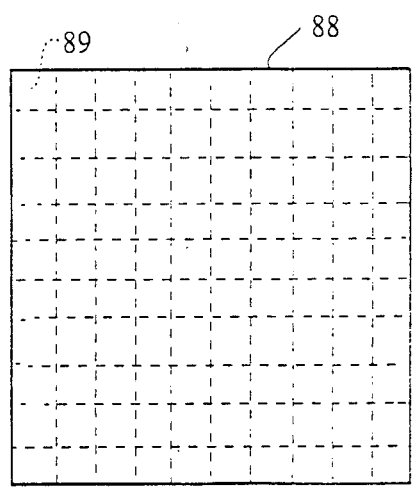
Figure 12:
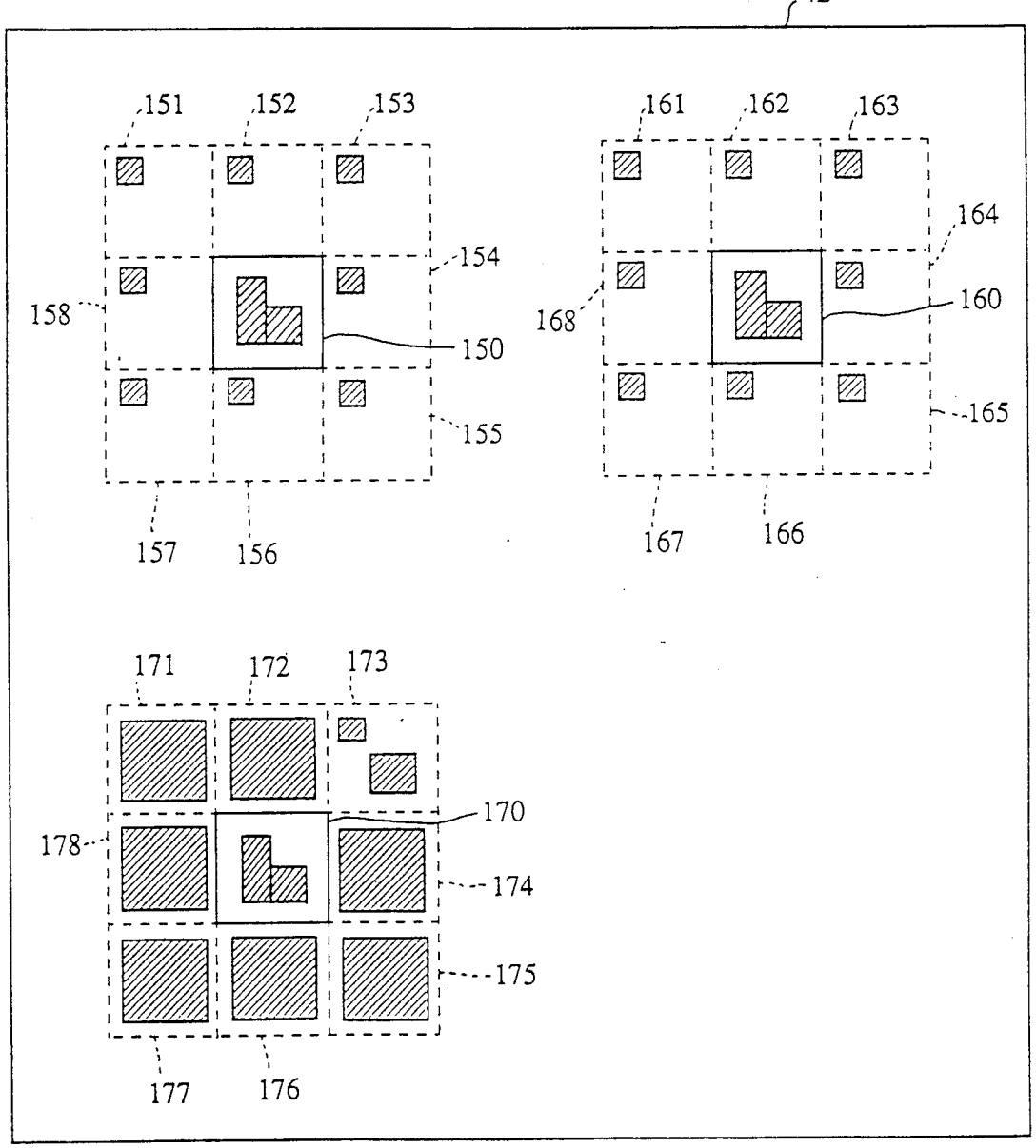

As shown in FIG. 11, there are a plurality of chip areas 88 on a semiconductor wafer 87. In each chip area, an LSI pattern involving various shapes is formed. According to LSI pattern data for each chip, the chip area 88 is divided into a plurality of small zones 89. How to divide the chip area 88 is properly determined according to the LSI pattern and other conditions. In this embodiment, the conditions are 40 kV of electron beam acceleration voltage, 1 $\mu$m of resist film thickness, 0.08 $\mu$m of forward scattering, 7 $\mu$m of backward scattering $\sigma$B and 30 $\mu$m of the size of each small zone.

Internal shapes of respective small zones 89 are recognized. FIG. 12 is an enlarged view of the right drawing of FIG. 11. In FIG. 12, small zones having no shape are omitted for the sake of simplicity. The kinds and arrangements of internal shapes in the respective small zones 89 are recognized, and small zones 150, 160 and 170 that have identical internal shapes are detected. For each of the small zones 150, 160 and 170, peripheral small zones existing within a predetermined distance are selected, and the arrangements of internal shapes in the peripheral small zones are examined. In this embodiment, the predetermined distance is 3$\sigma$B equal to 21 $\mu$m.

The small zone 150 has peripheral small zones 151 to 158 in the clockwise direction. Similarly, the small zone 160 has peripheral small zones 161 to 168, and the small zone 170 has peripheral small zones 171 to 178. Relations of internal shapes in these peripheral zones are as follows:

Zone 151 = zone 161 ≠ zone 171 zone 152 = zone 162 ≠ zone 172 zone 158 = zone 168 ≠ zone 178

Therefore, the proximity effect on the small zone 150 is the same as that on the small zone 160. Internal shapes included in the small zone 170 are the same as those included in the small zones 150 and 160 but the peripheral small zones of the small zone 170 are not the same as those of the small zones 150 and 160. Therefore, the proximity effect on the small zone 170 differs from that on each of the small zones 150 and 160.

In consequence, the small zones 150 and 170 cannot use a common correction quantity against the proximity effect. However, the small zones 150 and 160 can use a common correction quantity against the proximity effect. Namely, no calculation is needed for obtaining the correction quantity for the small zone 160 but the correction quantity found for the small zone 150 can be employed for the small zone 160.

This situation wherein one result of correction calculation is usable repeatedly, happens frequently in LSI patterns. In the example of FIG. 12, only two locations receive the same proximity effect. In an actual case, however, several to several tens of such a location exist.

According to experiments carries out by the inventors on a 4-kilo bit DRAM of 3 mm × 3 mm, the conventional correcting method (matrix technique) consumed about 14 hours with a 14-MIPS large computer to calculate correction quantities. According to the method of the embodiment, the time consumption was about two hours. That means the embodiment can improve the processing speed seven times the conventional method. The inventors have confirmed that the correction quantities themselves against the use of the embodiment.

Moreover, with the combination of the first and second embodiments, the correction quantity calculating time is reduced to 0.5 hour from 2.5 hours for the 4M DRAM as described in the first embodiment.

The present invention is not limited to the embodiments described in the above and various modifications will be possible over the invention without departing from the spirit thereof.

For example, the size of each small zone divided from the pattern writing area is not limited to $3\sigma B$ but may properly be determined according to specifications. However, if the size of each small zone is too large, effective correction against the proximity effect will not be expected. On the contrary, if the size is too small, the number of adjacent small zones to be referred will increase from 8 in the embodiment to, for instance, 24 or 48 to complicate the pattern comparing processes.

The method of calculating correction quantities to compensate the proximity effect may be the matrix method, or any other methods if they can calculate the correction quantities for the respective small zones.

The present invention is applicable not only for electron beam lithography apparatuses but also for ion beam lithography apparatuses.

In summary, the first embodiment of the invention finds correction emission quantities for respective positions in each of shapes involved in a pattern to be in order to compensate the backward scattering caused in writing rectangles around the positions. The correction emission quantities are deducted from a set emission quantity to compensate the proximity effect and provide optimum electron beam emission quantities with which the pattern of high dimensional accuracy can be written. The first embodiment can solve the drawback of the conventional method of taking a long time in calculating the correction quantities and determine the optimum emission quantities in a short time. Therefore, the invention is applicable for VLSIs and future VLSIs.

The second embodiment of the invention can omit repetitive correction calculations to be carried out on identical shapes involved in a pattern. Namely, the shapes that receive the same proximity effect in the pattern are not processed repeatedly to obtain their correction quantities. Therefore, the second embodiment can shorten a correction calculation time and quickly determine optimum electron beam emission quantities with which the proximity effect is compensated to write the pattern with high dimensional accuracy.

What is claimed is:

1. A method of writing a pattern involving various shapes on a sample with charged beams, by finding optimum charged beam emission quantities for respective positions (xj, yj) in each of the shapes and writing the shapes with charged beams of the optimum emission quantities, for each of the positions (xj, yj), the method comprising the steps of:
   (a) extracting shapes Ti which exist at least partly within a distance "r" from the position for which the optimum charged beam emission quantity is to be found in question;
   (b) finding emission correction quantities Qij related to the shapes Ti according to distances from the position in question to about the centers of the shapes Ti and the sizes of the shapes Ti to compensate backward scattering effects on the position in question caused by the shapes Ti;
   (c) finding a total emission correction quantity Rj for the position in question by summing up the emission correction quantities Qij related to the shapes Ti; and
   (d) determining an optimum emission quantity for the position in question by using the total emission correction quantity Rj and a predetermined emission quantity S.

2. The method as claimed in claim 1, wherein the optimum emission quantity is determined by deducting the total emission correction quantity Rj from the predetermined emission quantity S in the step (d).

3. The method as claimed in claim 1, wherein said step (b) of finding the emission correction quantities Qij employs a table prepared in advance to define relations between the emission correction quantities and the distances from the positions (xj, yj) to the shapes Ti and the sizes of the shapes Ti, and reads the emission correction quantities Qij out of the table.

4. The method as claimed in claim 1, wherein said step (b) of finding the emission correction quantities Qij employs a relational expression whose variables are the distances and sizes of shapes, and finds the emission correction quantities Qij by putting actual distances from the positions (xj, yj) to the shapes Ti and actual sizes of the shapes Ti in the variable of the relational expression.

5. The method as claimed in claim 1, wherein said step (a) of extracting the shapes Ti divides the pattern into small zones each with edge length of the distance "r", and extracts those of the shapes belonging to those of the small zones surrounding one of the small zones which contains the position in question.

6. The method as claimed in claim 1, wherein each of the positions (xj, yj) is the center of an area written by one shot of a variable shaped rectangular charged beam.

7. A method of writing a pattern involving various shapes on a sample with charged beams, by finding optimum charged beam emission quantities for respective positions (xj, yj) in each of the shapes and writing the shapes with charged beams of the optimum emission quantities, for each of the positions (xj, yj) the method comprising the steps of:

(a) preparing an inverted pattern by black-and-white-inverting the pattern;

(b) extracting, out of the inverted shapes, inverted shapes Ti which exist at least partly within a distance "r" from the position in question;

(c) finding emission correction quantities Qij related to the inverted shapes Ti according to distances from the position in question to about the centers of the inverted shapes Ti and the sizes of the inverted shapes Ti to compensate backward scattering effects of supposed charged beams on the position in question caused by the inverted shapes Ti when the emission of the charged beam at the inverted shapes Ti is supposed;

(d) finding a total emission correction quantity Rj the position in question by summing up the emission correction quantities Qij related to the inverted shapes Ti; and (e) determining an optimum emission quantity for the position in question by using an emission correction quantity which is obtainable by emitting charged beams to the whole area of the sample, a predetermined emission quantity S, and the total emission correction quantity Rj.

8. The method as claimed in claim 7, wherein the optimum emission quantity is determined by deducting the emission correction quantity from the predetermined emission quantity S and by adding the total emission correction quantity Rj to a result of the deduction in the step (e).

9. The method as claimed in claim 7, wherein said step (c) of finding the emission correction quantities Qij employs a table prepared in advance to define relations between the emission correction quantities and the distances from the positions (xj, yj) to the inverted shapes Ti and the sizes of the inverted shapes Ti, and reads the emission correction quantities Qij out of the table.

10. The method as claimed in claim 7, wherein said step (c) of finding the emission correction quantities Qij employs a relational expression whose variables are the distances and sizes of inverted shapes, and finds the emission correction quantities Qij by putting actual distances from the positions (xj, yj) to the inverted shapes Ti and actual sizes of the inverted shapes Ti in the variables of the relational expression.

11. An apparatus for writing a pattern involving various shapes on a sample with charged beams, by finding optimum charged beam emission quantities for respective positions (xj, yj) in each of the shapes and writing the shapes with charged beams of the optimum emission quantities, the apparatus comprising:

(a) charged beam emitting means for emitting charged beams to the sample;

(b) emission quantity adjusting means for adjusting the charged beams emitted from said emitting means; and (c) control means for extracting for each of the positions (xj, yj) shapes Ti which exist at least partly within a distance "r" from the position in question, finding emission correction quantities Qij related to the shapes Ti according to distances from the position in question to about the centers of the shapes Ti and the sizes of the shapes Ti to compensate backward scattering effects on the position in question caused by the shapes Ti, finding a total emission correction quantity Rj for the position in question by summing up the emission correction quantities Qij related to the shapes Ti, determining an optimum emission quantity for the position in question by deducting the total emission correction quantity Rj from a predetermined emission quantity S, and controlling said emission quantity adjusting means such that charged beams of the optimum emission quantities are emitted to the respective positions (xj, yj).

12. The apparatus as claimed in claim 11, wherein said control means is provided with a table defining relations between the emission correction quantities and the distances from the positions (xj, yj) to the shapes Ti and the sizes of the shapes Ti, and reads the emission correction quantities Qij out of the table.

13. The apparatus as claimed in claim 11, wherein said control means is provided with a relational expression whose variable, are the distances and sizes of shapes, and finds the emission correction quantities Qij by putting actual distances from the positions (xj, yj) to the shapes Ti and actual sizes of the shapes Ti in the variables of the relational expression.

14. The apparatus as claimed in claim 11, wherein said emission quantity adjusting means comprises a blanking deflector for adjusting an emission time of charged beams emitted from said charged beam emitting means.

15. A method of writing an LSI pattern involving various shapes on a sample with charged beams, by determining correction quantities for compensating proximity effects for respective plural small zones divided from the pattern and writing the pattern according to the correction quantities, the method comprising the steps of:

(a) dividing the pattern into the plural small zones;

(b) detecting identical small zones A out of the small zones, the small zones A having identical internal shapes of the same kind and arrangement as well as having identical peripheral small zones B, i.e., corresponding ones of the small zones B having identical internal shapes of the same kind and arrangement;

(c) calculating an optimum correction quantity for one of the small zones A; and (d) employing a result of the calculation of said step (c) as an optimum correction quantity of each of the other small zones Aj.

16. The method as claimed in claim 15, wherein said stop (c) of calculating the optimum correction quantity including the steps of:

extracting shapes Ti belonging to the small zones B surrounding the small zone A which includes a position (xj, yj) for which the optimum correction quantity is to be calculated;

finding emission correction quantities Qij related to the shapes Ti according to distances from the position (xj, yj) to the centers of the shapes Ti and the sizes of the shapes Ti to compensate backward scattering effects on the position (xj, yj) caused by the shapes Ti; and finding a total emission correction quantity Rj as the optimum correction quantity by summing up the emission correction quantities Qij.

17. The method as claimed in claim 16, wherein the step of finding the emission correction quantities Qij employs a table prepared in advance to define relations between the emission correction quantities and the distances from the position (xj, yj) to the shapes Ti and the sizes of the shapes Ti, and reads the emission correction quantities Qij out of the table.

18. The method as claimed in claim 16, wherein the step of finding the emission correction quantities Qij employs a relational expression whose variables are the distances and sizes of shapes, and finds the emission correction quantities Qij by putting actual distances from the position (xj, yj) to the shapes Ti and actual sizes of the shapes Ti in the variables of the relational expression.

19. An apparatus for writing a pattern involving various shapes on a sample with charged beams, by finding optimum charged beam emission quantities and writing the shapes with charged beams of the optimum emission quantities, the apparatus comprising:

(a) charged beam emitting means for emitting charged beams to the sample;

(b) emission quantity adjusting means for adjusting the charged beams emitted from said emitting means; and (c) control means for dividing the pattern into plural small zones, detecting identical small zones A out of the small zones, the small zones A having identical internal shapes of the same kind and arrangement as well as having identical peripheral small zones B, i.e., corresponding ones of the small zones B having identical internal shapes of the same kind and arrangement, calculating an optimum correction quantity for one of the small zones A, employing a result of the calculation as an optimum correction quantity of each of the other small zones A, and controlling said emission quantity adjusting means such that charged beams of the optimum emission quantities are emitted to write the pattern.

* * * * *